US011791319B2

(12) United States Patent
Cai et al.

(10) Patent No.: US 11,791,319 B2
(45) Date of Patent: Oct. 17, 2023

(54) EDGE-CONNECTED SEMICONDUCTOR SYSTEMS

(71) Applicant: NVIDIA Corp., Santa Clara, CA (US)

(72) Inventors: Joey Cai, Shenzhen (CN); Tiger Yan, Shenzhen (CN); Jacky Zhu, Shenzhen (CN); Oliver Yi, Shenzhen (CN); Zach Wang, Shenzhen (CN)

(73) Assignee: NVIDIA Corporation, Santa Clara, CA (US)

( * ) Notice: Subject to any disclaimer, the term of this patent is extended or adjusted under 35 U.S.C. 154(b) by 135 days.

(21) Appl. No.: 17/163,918

(22) Filed: Feb. 1, 2021

(65) Prior Publication Data

US 2022/0246589 A1  Aug. 4, 2022

(51) Int. Cl.
*H01L 25/10* (2006.01)
*H01L 23/498* (2006.01)
*H01L 25/00* (2006.01)
*H01L 23/367* (2006.01)
*H01R 12/70* (2011.01)

(52) U.S. Cl.
CPC .......... *H01L 25/105* (2013.01); *H01L 23/367* (2013.01); *H01L 23/49805* (2013.01); *H01L 25/50* (2013.01); *H01R 12/7076* (2013.01)

(58) Field of Classification Search
CPC .............. H01L 25/105; H01L 23/367; H01L 23/49805; H01L 25/50; H01L 2225/1064; H01L 2924/15311; H01R 12/7076; H05K 2201/1053; H05K 1/181
See application file for complete search history.

(56) References Cited

U.S. PATENT DOCUMENTS 4,814,857 A    3/1989  Werbizky
2015/0340343 A1*  11/2015  Chen ................... H01L 25/0657
                                                257/737

OTHER PUBLICATIONS

"NVLink and NVSwitch," Nvidia Corp., as downloaded from https://www.nvidia.com/en-us/data-center-nvlink on Feb. 1, 2021.
"NVIDIA Tesla V100 GPU Architecture," NVIDIA Corp., Aug. 2017.
"NVIDIA Tesla P100 Whitepaper," NVIDIA Corp., as downloaded from https://images.nvidia.com/content/pdf/tesla/whitepaper/pascal-architecture-whitepaper.pdf on Feb. 1, 2021.
Arunkumar, et al., "MCM-GPU: Multi-Chip-Module GPUs fro Continued Performance Scalability," ACM ISCA, Jun. 24-28, 2017, Toronto, CA.
Harris, Mark, "How NVLink Will Enable Faster, Easier Multi-GPU Computing," NVIDIA Corp., Nov. 14, 2014.
"NVLink," Wikipedia, as downloaded from https://en.wikipedia.org/wiki/NVLink on Feb. 21, 2021.

(Continued)

*Primary Examiner* — Karen Kusumakar
*Assistant Examiner* — Adam S Bowen

(57) ABSTRACT

Edge-connected semiconductor systems are described along with methods of making and using the same. First and second integrated circuit packages are obtained, each including a substrate assembly having top and bottom sides and an edge that extends between the top and the bottom sides. Edge contacts are disposed on the edges of the substrate assemblies. A ganged assembly is formed by establishing conductive paths between the edge contacts of the substrate assemblies. The ganged assembly is coupled to a printed circuit board ("PCB") by coupling host contacts on one or more of the substrate assemblies to corresponding contacts on the PCB.

20 Claims, 10 Drawing Sheets

(56) References Cited

OTHER PUBLICATIONS

Foley, Dennis, "NVLink, Pascal and Stacked Memory: Feeding the Appetite for Big Data," NVIDIA Corp., Mar. 25, 2014.
Harris, Mark, "Unified Memory in CUDA 6," NVIDIA Corp., Nov. 18, 2013.
"List of Integrated Circuit Packaging Types," Wikipedia, as downloaded from https://en.wikipedia.org/wiki/List_of_integrated_circuit_packaging_types on Feb. 1, 2021.
"Coprocessor," Wikipedia, as downloaded from https://en.wikipedia.org/wiki/Coprocessor on Feb. 1, 2021.
"Mesh Networking," Wikipedia, as downloaded from https://en.wikipedia.org/wiki/Mesh_networking on Feb. 1, 2021.
Weiss, Stewart, "Chapter 2: Parallel Architectures and Interconnection Networks," Western Michigan University, as downloaded from https://cs.wmich.edu/gupta/teaching/cs5260/5260Sp15web/lectureNotes/parallel%20architectures%20and%20interconections%20networks%20chapter02.pdf on Feb. 1, 2021.

* cited by examiner

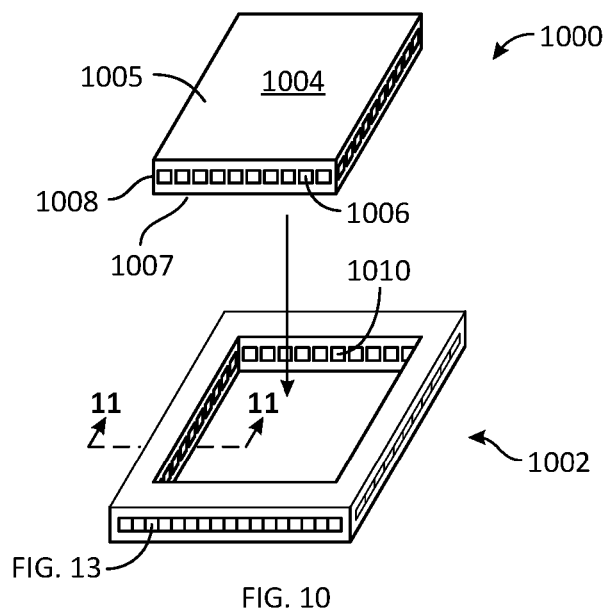
FIG. 10
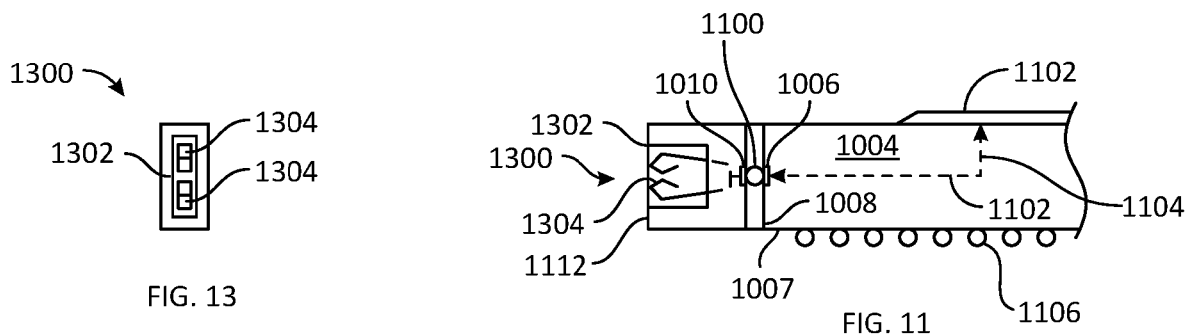
FIG. 13
FIG. 11
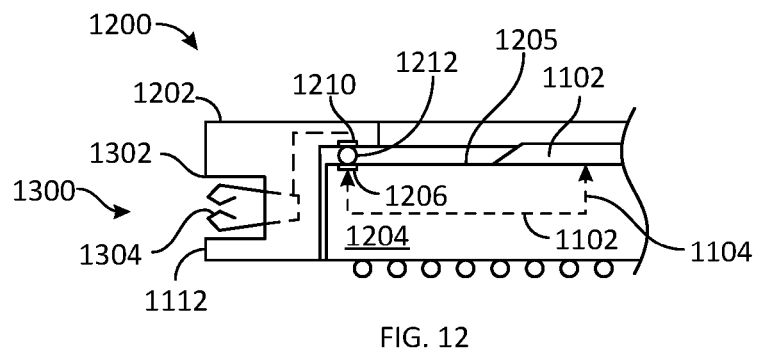
FIG. 12
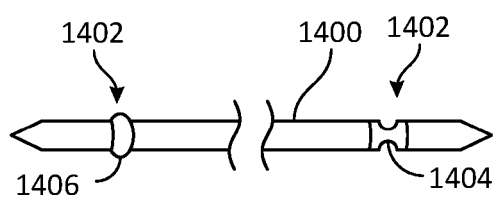
FIG. 14

EDGE-CONNECTED SEMICONDUCTOR SYSTEMS

BACKGROUND

Computer system hardware often includes one or more discrete data processing devices coupled to a printed circuit board ("PCB"). For example, one or more single- or multi-core central processing unit ("CPU") packages may be mounted to a host system PCB. The host system PCB may constitute a motherboard in a stand-alone computer, such as a workstation computer, or may constitute a system board in a single- or multi-node rack mounted server, such as in a data center.

Such hardware may additionally include one or more discrete coprocessor or accelerator units. In general, a coprocessor or accelerator unit is a data processing device that serves to complement or supplement the operations of a CPU. A coprocessor or accelerator unit may be identical in function to a CPU or may have more specialized functions, as is the case with a graphics processing unit ("GPU"). A GPU is typically equipped to accelerate specialized operations, such as matrix multiplications, that are required to implement a computer graphics pipeline. In order to do so, a GPU may include at least one high-performance arithmetic logic unit ("ALU") coupled to a high-bandwidth local memory. Because of the presence of the high-performance ALU and the high-bandwidth local memory, a GPU not only can accelerate graphics-related computations, but also can be employed to perform more general mathematical operations unrelated to graphics. For example, GPUs have been employed to support ALU-intensive operations that are required by certain artificial intelligence algorithms and workflows.

Numerous practical problems arise in the context of designing and manufacturing computer system hardware to be suitable for use in applications such as those just described as well as others. First, as technology advances, the compute demands that are placed on the CPUs and the coprocessor and/or accelerator units increase. This, in turn, requires that the various processing units be redesigned periodically to make use of new silicon technologies and new internal architectures. Such redesign efforts inevitably are accompanied by significant expense and technology risk. Second, transferring data between the processing units in a host computer requires efficient support from specialized subsystems and data pathways on the motherboard or the system board PCBs. This, in turn, complicates the design and manufacture of the PCBs, which complication also brings added expense and technology risk. Third, the cooling requirements of high-performance processors, combined with the space constraints that are imposed by fixed form factor system boards, often lead to a desire on the part of system designers for more flexibility in component selection and placement.

BRIEF DESCRIPTION OF THE DRAWINGS

Techniques and apparatus for addressing these and other challenges will be described below with reference to the accompanying drawings, in which like reference numbers generally denote like or similar elements.

FIG. 10 is an oblique view illustrating an integrated circuit substrate and a single-chip connector frame, together forming a substrate assembly in accordance with embodiments.

FIG. 11 is a sectional view of the substrate and connector frame of FIG. 10, taken along the section indicated in FIG. 10, illustrating an example socket in accordance with embodiments, wherein the substrate is coupled to the connector frame in accordance with a first example technique.

FIG. 12 is a sectional view illustrating the example socket of FIG. 11, wherein the substrate is coupled to the connector frame in accordance with a second example technique.

FIG. 13 is an orthogonal view of the example socket of FIG. 11.

FIG. 14 illustrates a class of removable pins for use with the sockets of FIGS. 10-13 and shows two different example pin retention features in accordance with embodiments.

DETAILED DESCRIPTION

This disclosure describes multiple embodiments by way of example and illustration. It is intended that characteristics and features of all described embodiments may be combined in any manner consistent with the teachings, suggestions and objectives contained herein. Thus, phrases such as "in an embodiment," "in one embodiment," and the like, when used to describe embodiments in a particular context, are not intended to limit the described characteristics or features only to the embodiments appearing in that context.

The phrases "based on" or "based at least in part on" refer to one or more inputs that can be used directly or indirectly in making some determination or in performing some computation. Use of those phrases herein is not intended to foreclose using additional or other inputs in making the described determination or in performing the described computation. Rather, determinations or computations so described may be based either solely on the referenced inputs or on those inputs as well as others. The phrase "configured to" as used herein means that the referenced item, when operated, can perform the described function. In this sense an item can be "configured to" perform a function even when the item is not operating and is therefore not currently performing the function. Use of the phrase "configured to" herein does not necessarily mean that the described item has been modified in some way relative to a previous state. "Coupled" as used herein refers to a connection between items. Such a connection can be direct or can be indirect through connections with other intermediate items. Uses of the term "coupled" and its variants herein include the coupling of components by electrically conductive connections or paths, except where the context clearly indicates otherwise. Terms used herein such as "including," "comprising," and their variants, mean "including but not limited to." Articles of speech such as "a," "an," and "the" as used herein are intended to serve as singular as well as plural references except where the context clearly indicates otherwise.

The term "rectangle" as used herein includes square shapes as well as non-square rectangular shapes.

Figure 1:
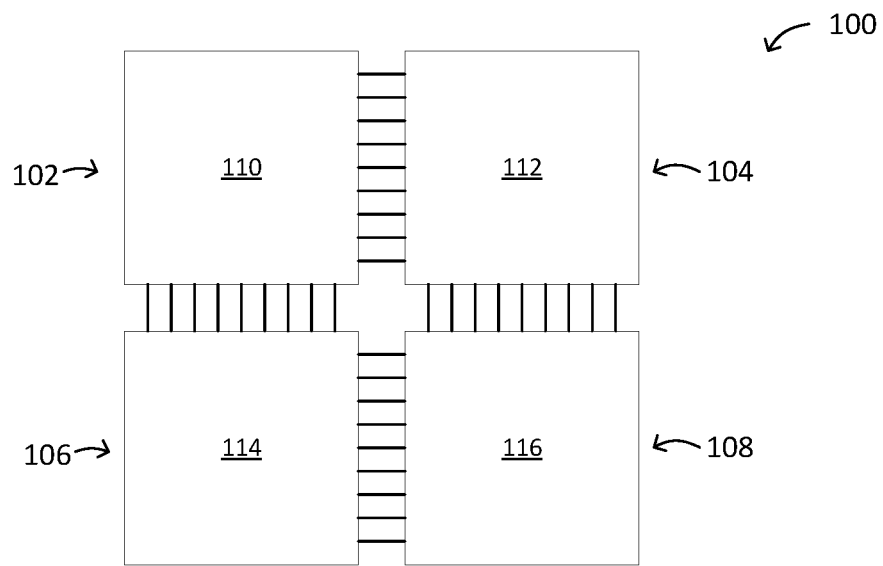
FIG. 1 is a top view illustrating four integrated circuit packages formed into a ganged assembly in accordance with embodiments.

FIG. 1 is a top view illustrating four edge-connected integrated circuit packages 102, 104, 106, 108 coupled to one another in a ganged assembly 100. Each of the integrated circuit packages includes a respective substrate assembly 110, 112, 114, 116. Each of the substrate assemblies may include one or more integrated circuit dies mounted thereon or included therein. In the embodiment shown, edge contacts disposed on each one of the substrate assemblies are coupled to corresponding edge contacts on another one of the substrate assemblies by package-to-package conductive paths 118.

Figure 2:
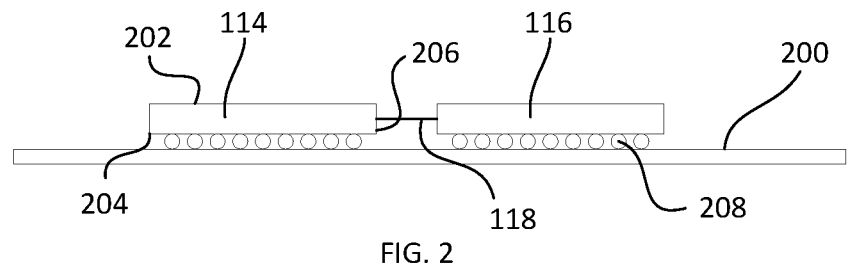
FIG. 2 is a side view illustrating the integrated circuit packages of FIG. 1 coupled to a PCB in accordance with embodiments.

FIG. 2 illustrates the ganged assembly of FIG. 1 coupled to a generally planar PCB 200. As can be seen in FIG. 2, each one of the substrate assemblies is generally planar and has a top side 202 and a bottom side 204. An edge 206 extends between the top and the bottom sides. The edge contacts of each integrated circuit package are disposed on the edge of the substrate assembly of the package. In the embodiment shown, each integrated circuit package also includes host system contacts 208 formed on the bottom side of the respective substrate assembly. The ganged assembly is coupled to the PCB by coupling the host system contacts to corresponding contacts on or in the PCB as shown.

Host system contacts 208 may take a variety of forms. In the illustrated embodiment, the host system contacts take the form of a ball grid array. In other embodiments, the host system contacts may take other forms, such as a land grid array or a pin grid array. The corresponding contacts on or in the PCB may be formed on or in the PCB itself, [of] or may take the form of one or more sockets mounted to the PCB and in which the host system contacts on the integrated circuit packages of the ganged assembly are inserted. In the embodiment shown, the planes of the substrate assemblies of the integrated circuit packages are substantially parallel with the plane of the PCB to which the substrate assemblies are coupled.

As can be seen in FIG. 2, the package-to-package conductive paths coupled between the edge contacts of the substrate assemblies do not include traces formed on or in the PCB. In this manner, data communication between the integrated circuit packages of the ganged assembly can be performed directly, using package-to-package conductive paths 118. This, in turn, avoids the need to provide supporting circuitry and/or conductive pathways on the PCB for direct package-to-package communications.

Figure 3:
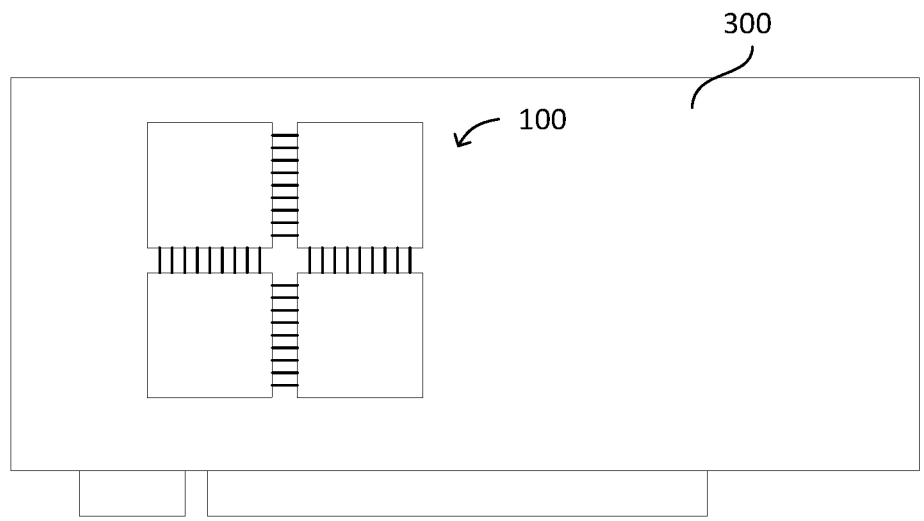
FIG. 3 is a top view illustrating the integrated circuit packages of FIG. 1 coupled to a PCB in accordance with embodiments, wherein the PCB is a peripheral component interconnect express ("PCIe") card.
Figure 4:
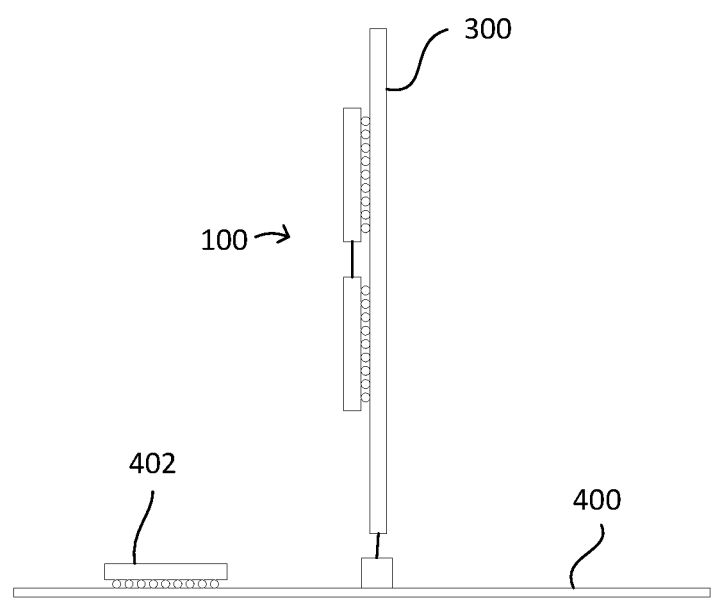
FIG. 4 is a side view illustrating the PCIe card of FIG. 3 coupled to a motherboard or system of a host system computer in accordance with embodiments.

The PCB may itself take a variety of forms. For example, the PCB may comprise a motherboard of a stand-alone computer, such as a workstation, desktop or laptop, or it may comprise a system board of a rack-mounted server computer. In still further embodiments, the PCB may constitute an add-on card that is configured to be mounted to a motherboard or system board of a host computer. FIGS. 3 and 4 illustrate such an example. In FIG. 3, the ganged assembly is shown coupled to a peripheral component interconnect express ("PCIe") card 300. In FIG. 4, the PCIe card is shown mounted to a motherboard 400 of a host computer. One or more CPUs 402 may also be installed on the motherboard, as shown. In such embodiments, the CPUs may perform data communications with any or all of the integrated circuit packages in the ganged assembly via host system contacts 208 and corresponding interconnect circuitry and data pathways on or in the PCB and/or on or in the add-on card.

Figure 5A:
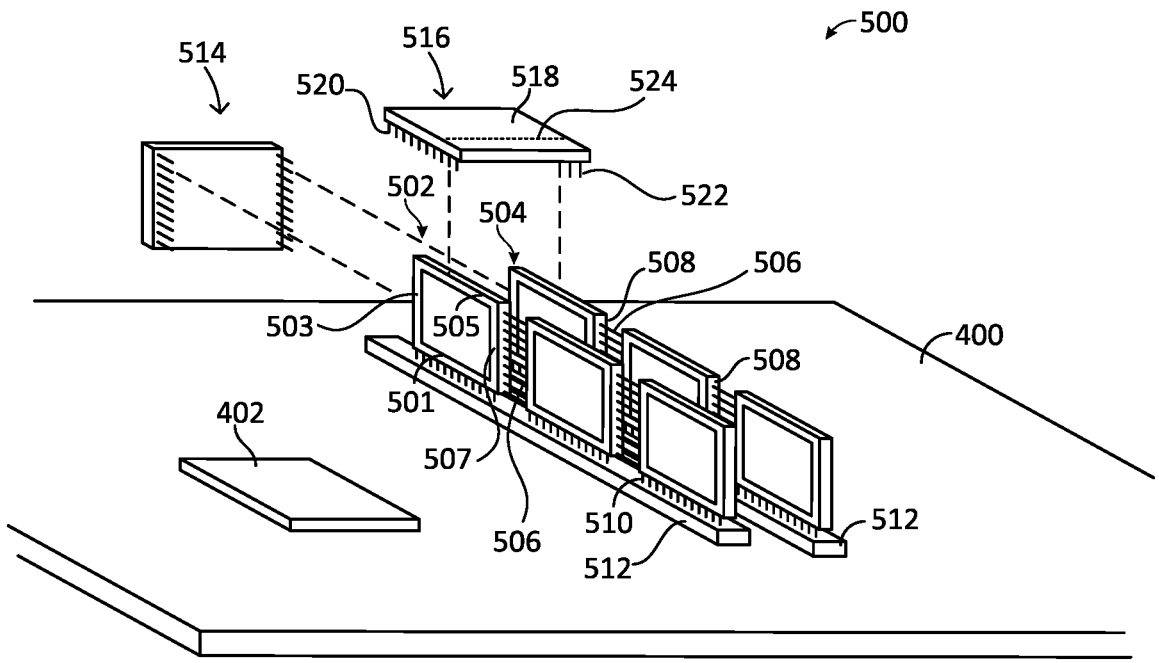
FIG. 5A is an oblique view illustrating six integrated circuit packages formed into two ganged assemblies and coupled to a PCB in accordance with embodiments.

FIG. 5A illustrates a class of embodiments 500 in which the planes of the substrate assemblies of the integrated circuit packages are oriented orthogonally to the plane of the PCB to which they are coupled. Two ganged assemblies 502, 504 of edge-connected integrated circuit packages are shown. Each of the substrate assemblies has a generally rectangular shape such that its edge comprises four edge sections, each corresponding respectively to one of the four sides of the rectangle. For example, the four edge sections of one of the integrated circuit packages are shown at 501, 503, 505, 507. In each of the integrated circuit packages, edge contacts may be disposed on each of the four edge sections. A first subset of the edge sections on a given integrated circuit package (for example, edge sections 503 and/or 507), have their edge contacts coupled to edge contacts on another one of the integrated circuit packages by package-to-package conductive paths 506. As can be seen in the drawing, package-to-package conductive paths 506 do not include traces formed on or in the PCB. A second subset of the edge sections—for example, edge sections 501—have their edge contacts coupled to corresponding contacts 512 on or in the PCB. In the embodiment shown, the latter coupling is accomplished by conductive paths 510 extending between edge sections 501 and sockets 512 mounted to the PCB. Sockets 512 are each coupled to corresponding contacts on or in the PCB. In such embodiments, the edge contacts disposed on edge sections 501 of the integrated circuit packages in the ganged assemblies constitute host system contacts.

As was the case for the embodiments described in relation to FIGS. 1-4, PCB 400 may comprise a motherboard of a stand-alone computer, a system board of a rack-mounted server computer, or an add-on card that is configured to be mounted to a motherboard or system board of a host computer. In the illustrated embodiment, PCB 400 has a CPU 402 mounted thereon, which is coupled to the host system contacts of the ganged assemblies by circuitry and conductive paths on or in the PCB. In embodiments wherein the PCB is an add-on card, the CPU may be disposed on a motherboard or system board and coupled to the host system contacts by circuitry and conductive paths provided on or in the motherboard/system board and on or in the add-on card.

The configurations of the integrated circuit packages in ganged assemblies 502, 504 correspond to a grid-like mesh network topology in which each integrated circuit package is directly edge-connected to an adjacent integrated circuit package in the same row. The illustrated mesh network topology may be extended to a toroidal mesh topology in which one or more edge contacts of the integrated circuit packages in one row may be connected to edge contacts of an adjacent integrated circuit package in another row. This may be accomplished by coupling one or more bridge connectors to edge contacts of the integrated circuit packages. For example, a bridge connector 516 may be coupled to the integrated circuit packages at one or both ends of the two rows of the ganged assemblies, as shown, to establish a wrap-around connection at the ends of two rows in the mesh network. And a bridge connector 518 may be coupled to the tops of any two adjacent integrated circuit packages in the ganged assemblies, as shown, to establish a wrap-around connection at the ends of two columns in the mesh network. Each of the bridge connectors may, for example, comprise a frame 518, to which sets of pins 520, 522 are mounted. Each of pins 520 may be coupled directly to a corresponding one of pins 522 by conductive pathways formed on or in the frame, as indicated generally at 524.

Figure 5B:
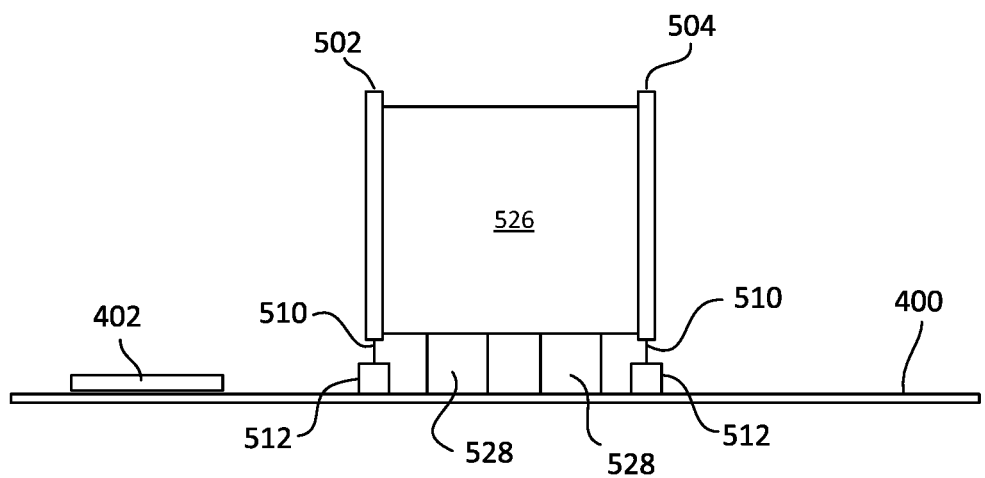
FIG. 5B is an orthographic view of the integrated circuit packages of FIG. 5A schematically illustrating a cooling device disposed between the ganged assemblies in accordance with embodiments.

FIG. 5B is an orthographic view of the integrated circuit packages of FIG. 5A, schematically illustrating a cooling device 526 disposed between the ganged assemblies in accordance with some embodiments. The cooling device may be disposed between the ganged assemblies such that opposite sides of the device are in thermal contact with a top or bottom side of one or more of the integrated circuit packages in the ganged assemblies, as shown. Such a cooling device may take a variety of forms, including an active fan-driven device, an active liquid cooling system, or a passive device such as a heat sink. In some embodiments, the cooling device may be mounted to the PCB for structural support, as indicated generally at 528.

In any of the above edge-connected semiconductor systems, each of the integrated circuit packages making up the ganged assembly may include at least one integrated circuit die configured to perform functions suitable for use in a multi-processor computer system. For example, the dies in each of the integrated circuit packages may include circuitry for implementing the functions of a CPU or the functions of a coprocessor or accelerator unit. Such functions may include a data processing unit, a local memory associated with the data processing unit, and a data communication unit configured to perform package-to-package communication with one or more of the other integrated circuit packages in the ganged assembly, and/or to perform data communication with elements of the host system such as CPU 402. In some embodiments, one or more of the integrated circuit packages in the ganged assembly may comprise a GPU. In still further embodiments, each of the integrated circuit packages in the ganged assembly or ganged assemblies may be substantially identical.

In any of these variants, the integrated circuit packages in the ganged assembly or ganged assemblies may be configured to implement one or more types of parallel processing regimes in order to accelerate large computations. In such parallel processing regimes, a large computation is generally divided into smaller sub-computations, which are then delegated to the individual data processing units in the multi-processor system. After the data processing units have completed their smaller sub-computations, the results of the sub-computations are combined to complete the original, larger computation. As an example, CPU 402 may delegate sub-computations to multiple GPUs in the ganged assembly or assemblies, and then combine results produced by the multiple GPUs to construct a single, final result.

In ideal cases, each of the data processing units completes its sub-computation independently of the other data processing units so that the sub-computations execute simultaneously and efficiently. In more practical cases, however, it often happens that the sub-computations being performed by the individual data processors in the multi-processor system are not entirely independent. For example, it can be the case that a single block of memory may contain data that is of interest to two different data processors at various times while they perform their respective sub-computations.

Figure 6:
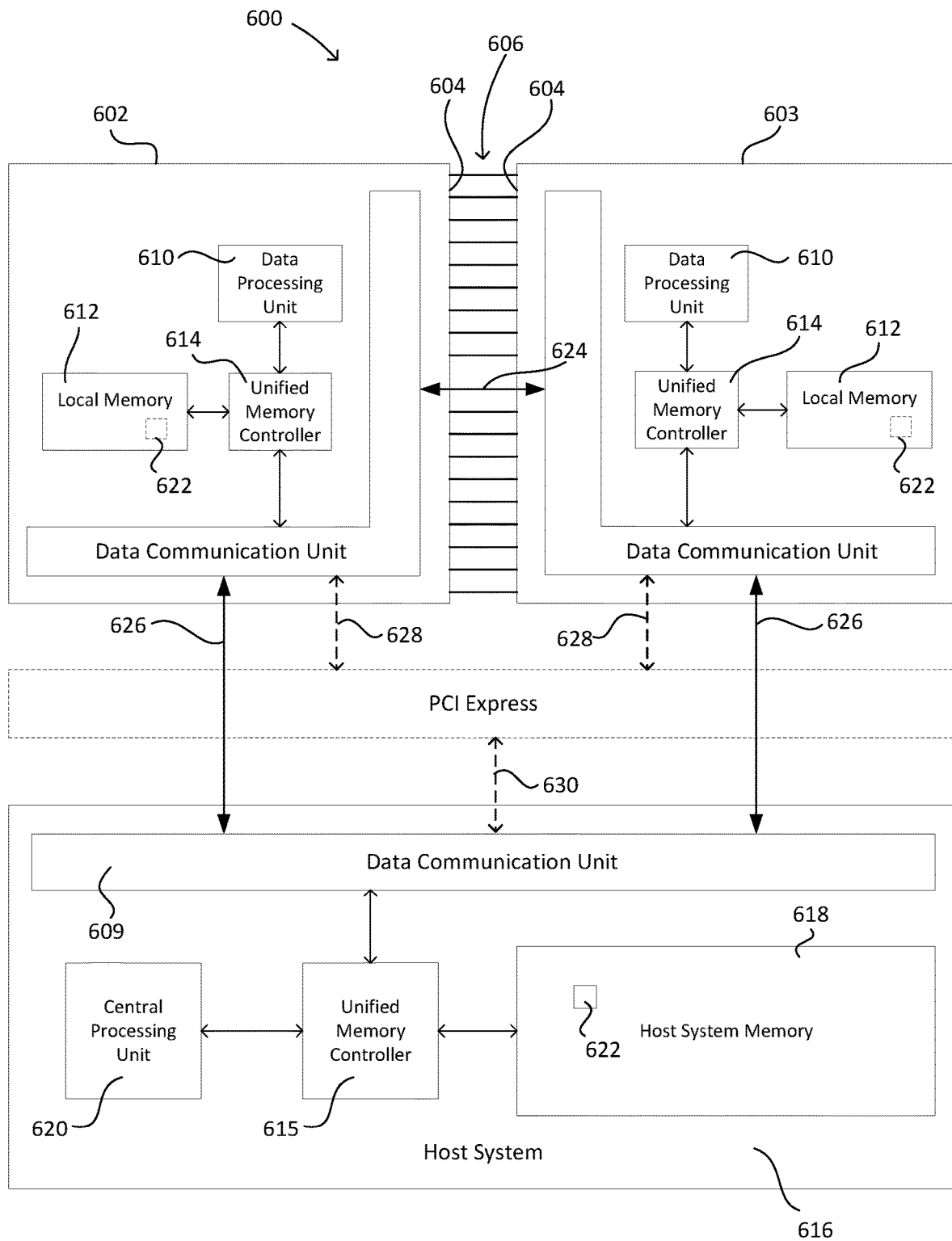
FIG. 6 is a block diagram schematically illustrating example circuitry within two edge-connected integrated circuit packages, coupled to circuitry within a host computer system, in accordance with embodiments.

FIG. 6 illustrates an example class of embodiments 600 that can be used to implement parallel computation while addressing such practical scenarios beneficially. System 600 includes two or more integrated circuit packages 602, 603 coupled together in a ganged assembly by edge connected package-to-package conductive paths 606. The package-to-package conductive paths couple edge contacts 604 on each of the integrated circuit packages to edge contacts on the other integrated circuit package. Each of the integrated circuit packages includes circuitry for implementing one or more data communication units 608, a data processing unit 610, a local memory 612, and a unified memory controller 614. It should be noted that the illustration of FIG. 6 is a block diagram that illustrates such a system logically. The physical locations of the various blocks depicted in the drawing may vary in actual embodiments, and their functions would typically be provided by circuitry disposed within an integrated circuit die that is mounted on or in the respective substrate assembly. For example, the data communication unit may by located on the die and coupled to edge contacts disposed on all four edge sections of a rectangular substrate assembly to which the die is mounted. Moreover, the data communication units may be configured to implement data communication between the edge-connected integrated circuit packages themselves, or between a respective one of the integrated circuit packages and elements of host system 616, or both. The host system, in turn, may include a data communication unit 609, a unified memory controller 615, a host system memory 618, and one or more CPUs 620.

Each local memory 612 is associated with a data processing unit 610 at least in the sense that the data processing unit can access data blocks stored in the local memory. In the embodiments shown, such access is accomplished through a unified memory controller 614 that is coupled to the local memory, to the data processing unit, and to the data communication unit as shown. Similarly, the unified memory controller 615 in the host system is coupled to the host system memory, to the CPU, and to data communication unit 609 of the host system.

The unified memory controllers may be configured to function together such that they implement a unified memory system, as follows. Once sub-computations have been assigned to each of the data processing units 610, both of the data processing units and the CPU may simultaneously have access to a given data block within a shared memory address space and may use the same memory address to access the data block. The address of the data block may correspond, for example, to the contents of a single pointer that is used in common by software executing on the two data processing units and on the CPU. (In some embodiments, the data processing units and the CPU may each have a separate copy of the pointer, stored locally.) Assume that such a pointer contains the starting address of data block 622 stored in the host system memory. When the data processing unit in integrated circuit package 602 requires access to the data block (e.g., when software executing in the data processing unit dereferences the pointer), the unified memory controller in package 602 uses its data communication unit to perform a memory transaction to access the data block, which results in the data block being transferred from the host system memory to the local memory in package 602. Specifically, the unified memory controller in host system 615 may respond to the memory transaction by supplying the data block from system memory, using data communication unit 609. Later, when the data processing unit in integrated circuit package 603 requires access to the data block, the unified memory controller in package 603 uses its data communication unit to perform a memory transaction to access the data block. The unified memory controller in package 602 responds to the memory transaction by supplying the data block from its local memory. In the course of performing the memory transactions, suitable data structures may be updated in each of packages 602, 603 and in the host system to indicate whether the locally-stored copy of the data block is currently valid.

Because memory transactions may occur directly between the two integrated circuit packages 602, 603 using edge-connected package-to-package conductive paths 606, memory can be shared between the data processing units contained in the two integrated circuit packages without the need to involve components in the host system or components on the PCB to which the packages are attached. Thus, related sub-computations being performed by the two data processing units may proceed more efficiently than in prior art systems.

Any suitable protocol may be used to implement the memory transactions between the edge connected integrated circuit packages and between either of the integrated circuit packages and the host system. In some embodiments, data communication units 608 and 609 may be configured to implement one or more high-speed serial communication links 624, 626. For example, one or more communication links 624 may be implemented directly between packages 602, 603 by using conductive paths 606 in differential pairs to form sub-links, each sub-link configured to transfer data in a single direction. Multiple sub-links may be combined to form a single bi-directional link. These links may be used to perform the memory transactions described above.

Similar techniques may be employed to implement host system links 626, such that the same type of high-speed communication link that is used for direct communications between the packages is also used for transactions between a package and the host system. In other embodiments, a different protocol and/or physical layer may be used to perform transactions between either one of the packages and the host system. For example, in embodiments such as those illustrated in FIGS. 3 and 4, links 628 may be implemented between each one of the packages and a PCIe system 300. The PCIe system may, in turn, communicate with the host system via the industry-standard PCIe protocol using a link 630.

Figure 7:
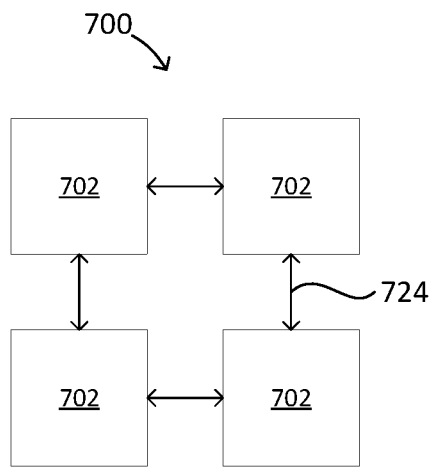
FIGS. 7-9 are block diagrams schematically illustrating edge-connected data communication links coupling several integrated circuit packages together in various network topologies in accordance with embodiments.
Figure 8:
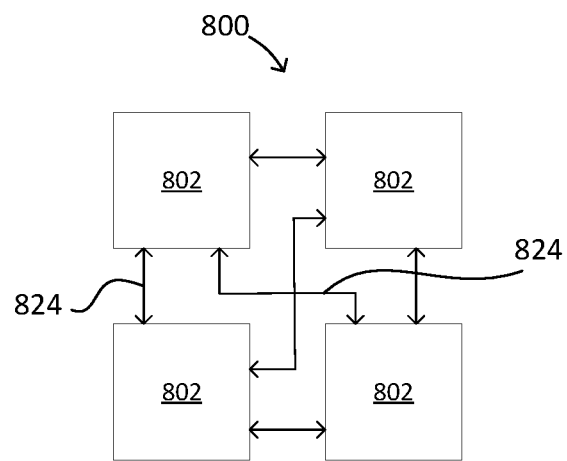
Figure 9:
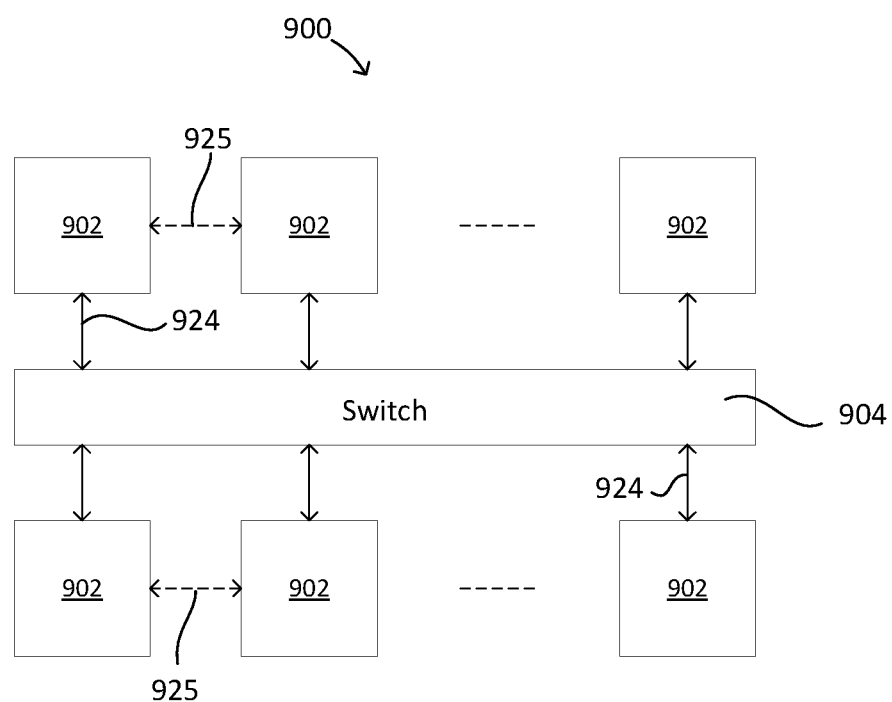

The protocols and physical layers used to implement high-speed data communication links 624 may be further configured to implement a variety of network topologies between edge-connected integrated circuit packages and/or the host system. For example, FIG. 7 illustrates a class of embodiments 700 in which integrated circuit packages 702 are coupled by data communication links 724 to form a grid-like mesh network. In such a mesh network, each integrated circuit package is coupled to adjacent integrated circuit packages in the same row and/or to adjacent integrated circuit packages in the same column. FIG. 8 illustrates a class of embodiments 800, in which integrated circuit packages 802 are coupled by data communication links 824 in an all-to-all topology. In an all-to-all topology, each integrated circuit package has a direct data communication link to every other integrated circuit package in the network. FIG. 9 illustrates a class of embodiments 900 in which an all-to-all topology is accomplished logically, instead of physically as in embodiments 800. In embodiments 900, each integrated circuit package 902 has a direct data communication link 924 to a switch unit 904. All-to-all connectivity is accomplished by the functions of switch unit 904, which may be configured to route transactions among the integrated circuit packages based on source and destination identifiers associated with the respective transactions. For example, source and receiver identifiers may be embedded in packet headers associated with the transactions, and switch unit 904 may route the packets accordingly. If desired, additional direct data communication links 925 may be provided between physically adjacent integrated circuit packages, as shown. In some embodiments, all of links 724, 824, 924, 925 may be implemented using package-to-package conductive paths such as those described above, coupled between edge contacts on the substrate assemblies of each of the respective integrated circuit packages, including the switch integrated circuit package 904.

In some cases, multiple identical coprocessor or accelerator units may be coupled together in a multi-processor arrangement for parallel processing in the manner described above, such that the combined compute power of the multiple individual units equals or exceeds that of a single processing unit having a more sophisticated design than those of the individual units. For example, multiple lower-end GPUs may be coupled together in a ganged assembly and used to perform parallel computing in the manner described above, such that the performance of the ganged assembly of lower-end GPUs equals or exceeds that of a single, higher-end GPU.

Physical realizations for the above-described package-to-package conductive paths may take a variety of forms. FIG. 10 illustrates a first example class of implementations 1000, wherein a single-chip connector frame 1002 is provided to receive a substrate 1004 of an integrated circuit package. In the embodiment shown in FIG. 10, the substrate is generally planar and has a top side 1005, a bottom side 1007, and an edge 1008 extending between the top and the bottom sides. The substrate in the illustrated embodiment has a rectangular shape, such that it defines four edge sections, each corresponding to one of the four sides of the substrate. Conductive lands 1006 are formed on at least one of the edge sections. The connector frame includes corresponding conductive lands 1010 disposed on an inside surface of the frame, as shown. Each of the lands on the frame corresponds to one of the lands on the edge of the integrated circuit package substrate. A substrate assembly is formed by inserting the substrate into the frame, as shown, and soldering, fusing, or otherwise electrically connecting the lands on the substrate to the corresponding lands on the frame.

FIG. 11 is a sectional view of the substrate and connector frame of FIG. 10, taken along the section indicated in FIG. 10. As can be seen in FIG. 11, the electrical connection between each land on the substrate and the corresponding land on the frame may be established by fusing a solder ball 1100 formed on either the substrate land or the frame land prior to inserting the substrate into the frame. As the sectional view of FIG. 11 illustrates, the lands on the substrate are coupled to one or more planes 1102 and vias 1104 formed in the substrate, using known techniques. The vias couple the lands on the substrate to circuitry within an integrated circuit die 1106 that is coupled to the substrate. The die may be coupled to any side of the substrate or may be housed inside it. The circuitry to which the lands are coupled may include, for example, one or more data communication units 608 within the die, as described above. Once assembled in this manner, the substrate and the single-chip connector frame constitute a substrate assembly having edge contacts, wherein the edge contacts are provided by the connector frame.

Techniques for providing the edge contacts on a substrate assembly in accordance with embodiments may vary. For example, FIG. 12 illustrates another technique 1200 for coupling a single-chip connector frame to a substrate. FIG. 12 is a sectional view corresponding to the view of FIG. 11, except with some structural differences: First, frame 1202 has a slightly different structure than has frame 1002, as can be seen at 1202. Second, substrate 1204 has lands 1206 formed on its top or bottom side 1205 instead of on its edge 1208. Nevertheless, once the substrate is assembled into the connector frame as shown, the substrate and the connector frame form a substrate assembly having edge contacts, wherein the edge contacts are provided by the connector frame, just as is the case with the embodiments shown in FIGS. 10 and 11. In embodiments 1200, the connector frame extends partially over the top or bottom side of the substrate so that lands 1210 formed on the connector frame align with the lands 1206 formed on the top or the bottom side of the substrate. A solder ball 1212 may be attached to the land on either side of the connection before the components are brought together, and then fused or re-flowed to establish the electrical connection between the connector frame and the substrate. As was the case in the embodiments of FIGS. 10 and 11, planes and vias inside substrate 1204 couple lands 1206 to circuitry within integrated circuit die 1102, which is also coupled to the substrate.

The embodiments of FIGS. 11 and 12 are shown with host system contacts 1106 disposed on a bottom side 1007 of the substrate, and the host system contacts are depicted as a ball grid array. As was described above, in other embodiments the host system contacts may take different forms. For example, they may be implemented as a land grid array or as a pin grid array as appropriate for a given application.

In either class of embodiments illustrated in FIGS. 11 and 12, the connector frame provides a plurality of sockets 1300 disposed on an edge 1112 of the substrate assembly. FIG. 13 is an orthogonal view relative to the view of FIG. 12 and illustrates the face of one such socket. Each socket defines an opening 1302 configured to receive a removable connecting pin such as the ones illustrated, by way of example, in FIG. 14. Resilient electrical contacts 1304 are disposed inside of the opening and are configured to establish electrical contact with a connecting pin when the pin is inserted into the socket. The resilient electrical contacts are coupled to lands 1010, 1210 inside the connector frame, as shown. In other embodiments, sockets 1300 may be formed integrally with the substrate.

The connecting pins may take a variety of forms as well. FIG. 14 illustrates two such forms by way of example. A removable connecting pin 1400 may be constructed using any suitably rigid electrically conductive material, such as copper or steel. The pin may include a retention feature 1402 on either end. The retention feature may comprise any mechanism configured to engage with the resilient contacts inside the socket 1300 so as to retain the pin within the socket after it is inserted. As the drawing illustrates, such a retention feature may comprise a notch 1404 or a ridge 1406 formed near the end of the pin. Other suitable structures may also be used. Moreover, in any embodiments, the package-to-package conductive paths between integrated circuit packages of a ganged assembly may be provided by conductors other than removable pins. For example, they may be provided by suitable cables having connectors thereon and configured to mate with the edge connectors of the integrated circuit packages.

Figure 15:
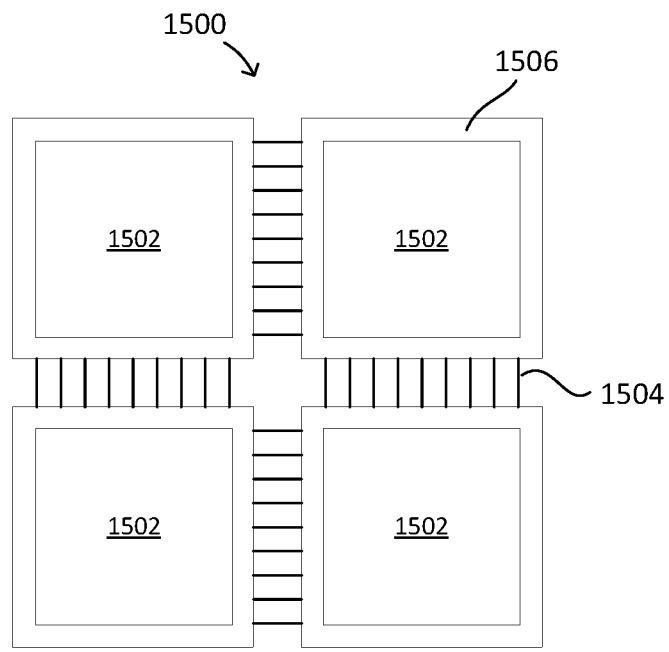
FIGS. 15 and 16 are orthogonal views illustrating integrated circuit packages, each one including a respective single-chip connector frame, wherein the packages are coupled to one another by removable pins in accordance with embodiments.
Figure 16:
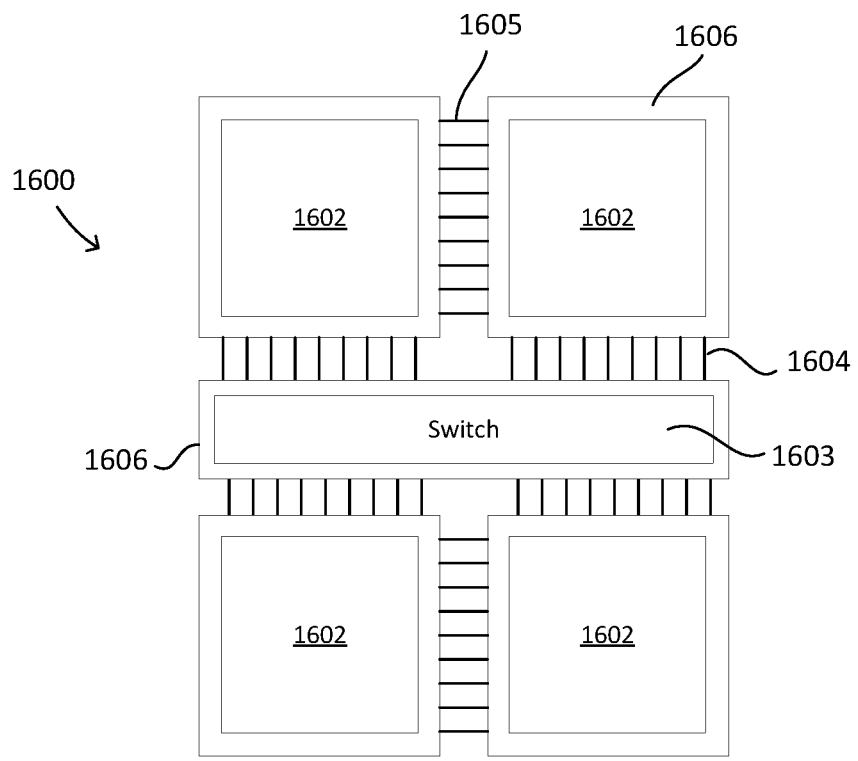

Embodiments such as those described in relation to FIGS. 10-14 may be used to implement any of the systems described above. For example, a system 1500 shown in FIG. 15 comprises four integrated circuit packages 1502 coupled to one another with removable pins 1504 to form a mesh network such as those described in relation to FIGS. 1 and 7. Each of substrate assemblies 1502 includes a single-chip connector frame 1506 such as those described in relation to FIGS. 10-14. Similarly, FIG. 16 illustrates a system 1600 comprising four integrated circuit packages 1602 coupled to a switch integrated circuit package 1603 with removable pins 1604. As in system 1500, each of the integrated circuit packages in system 1600, including the switch integrated circuit package, comprises a single-chip connector frame 1606. Systems such as system 1600 may be used to implement all-to-all connection networks such as those described in relation to FIG. 9.

A second example class of physical implementations for edge connected package-to-package conductive paths is illustrated in FIGS. 17-21. In this class of embodiments (referring now to FIG. 7) a multi-chip connector frame such as connector frame 1702 is provided, into which two or more integrated circuit packages 1704 are inserted. To receive the integrated circuit packages, the multi-chip connector frame includes two or more edge-connector sockets 1706, each of which is large enough to accommodate the size of a substrate assembly. In the embodiment illustrated, each edge-connector socket defines an opening in a central region 1708 thereof, so as to allow host contacts 1802 (see FIG. 18) on the bottom or the top side of a substrate assembly to engage corresponding host contacts on or in a PCB after the substrate assembly is inserted into the socket. The multi-chip connector frame may be constructed using any suitable known materials and techniques, such as plastic, PCB materials, or ceramic substrate materials.

Figure 17:
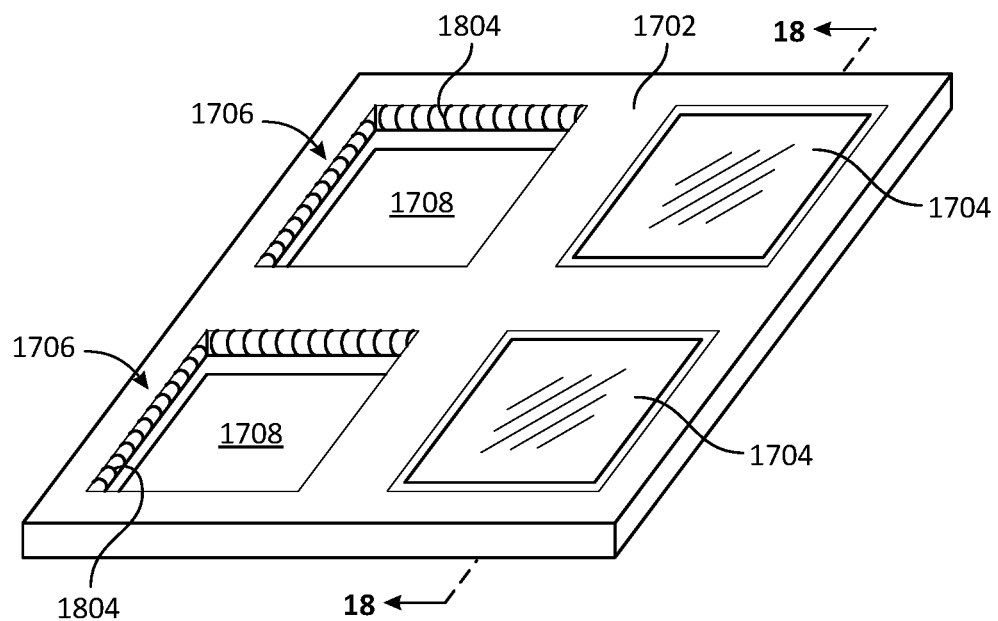
FIG. 17 is a perspective view illustrating a multi-chip connector frame in accordance with embodiments.
Figure 18:
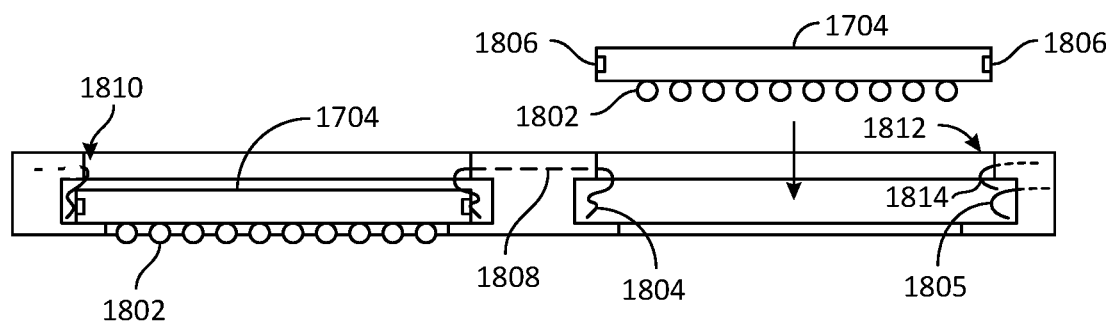
FIG. 18 is a sectional view of the multi-chip connector frame of FIG. 17, taken along the section indicated in FIG. 17, wherein one of the two integrated circuit packages depicted in FIG. 17 is shown outside of the connector frame.

FIG. 18 is a sectional view of the multi-chip connector frame of FIG. 17, taken along the section indicated in FIG. 17—except that, for clarity of illustration, in FIG. 18 only one of the two integrated circuit packages is shown seated inside its respective socket. Each socket of the multi-chip connector frame may include resilient electrical contacts 1804 disposed around the perimeter of the socket. Each such resilient electrical contact is configured to engage with a corresponding land 1806 formed on an edge of a substrate assembly 1704. Connecting paths such as wires, planes and/or vias 1808 may be formed on or in the body of the frame, as shown. The connecting paths on or in the frame may be used to provide any or all of the package-to-package conductive paths described above.

One or more resilient retention features 1810 may additionally be provided on the multi-chip connector frame. The retention features 1810 may be configured to retain an integrated circuit assembly in a socket after insertion. Such retention features need not be, but can be, as numerous as electrical contacts 1804. For example, in some embodiments, the retention features may be integrally formed with the electrical contacts, as shown at 1810. In other embodiments, the retention features may comprise separate resilient protrusions, as shown at 1812, wherein the retention feature 1814 is separate from the resilient electrical contact 1805. Other suitable structures may also be used for both the electrical contacts and the retention features. In any case, the integrated circuit packages, and the multi-chip connector frame into which the packages are inserted, together constitute a ganged assembly.

Figure 19:
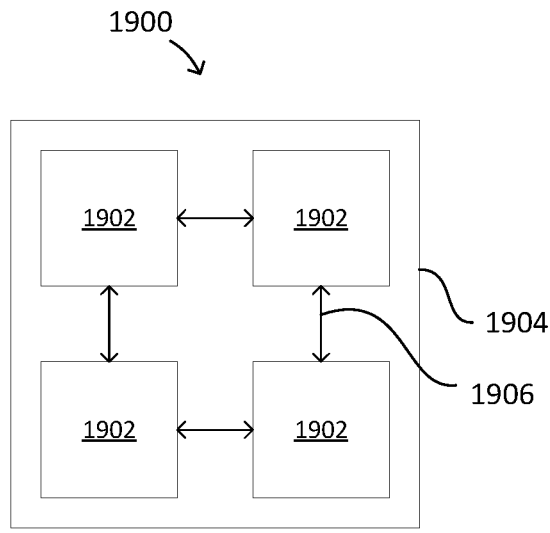
FIGS. 19-21 are block diagrams schematically illustrating integrated circuit packages housed in multi-chip connector frames, forming various ganged assemblies, and coupled to one another by edge-connected conductive paths in various network topologies in accordance with embodiments.
Figure 20:
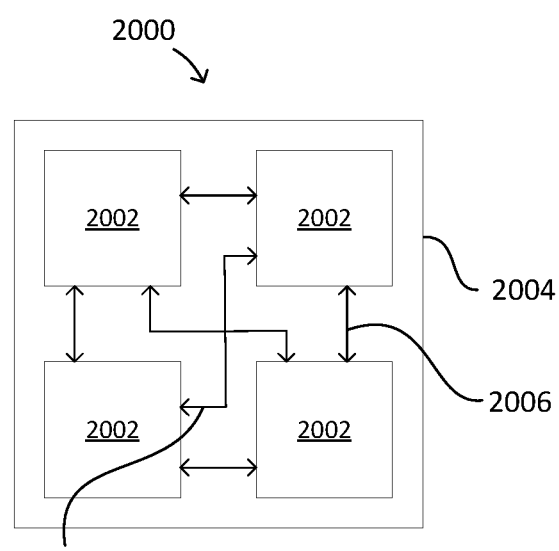
Figure 21:
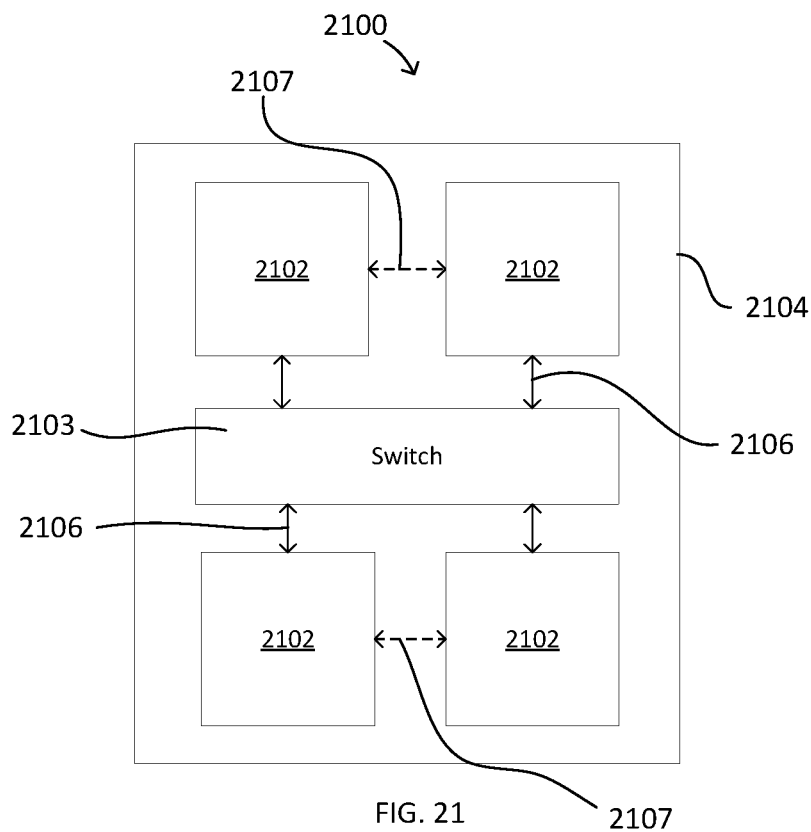
Figure 22:
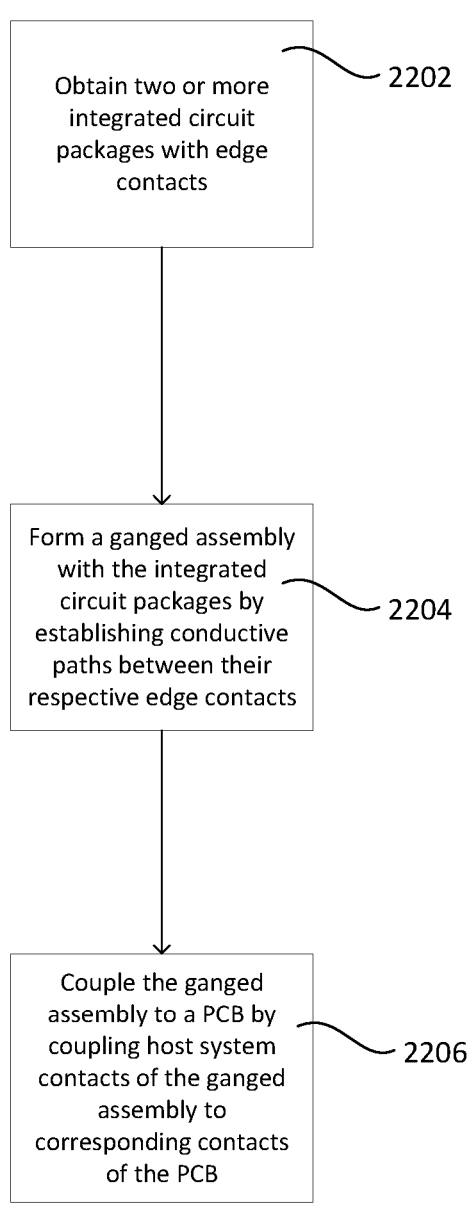
FIG. 22 is a flow diagram illustrating an example method of manufacturing edge-connected semiconductor assemblies in accordance with embodiments.

Embodiments such as those described in relation to FIGS. 17-18 may be used to implement any of the systems described above. For example, FIG. 19 illustrates a system 1900 comprising four integrated circuit packages 1902 housed in a multi-chip connector frame 1904. Conductors 1906 disposed on or in the body of the connector frame establish package-to-package conductive paths that couple the edge contacts of the substrate assemblies in a mesh network topology such as those described in relation to FIGS. 1 and 7. Similarly, FIG. 20 illustrates a system 2000 comprising four integrated circuit packages 2002 housed in a multi-chip connector frame 2004. Conductors 2006 on or in the body of the connector frame couple edge contacts on the substrate assemblies in an all-to-all connectivity network such as those described in relation to FIG. 8. FIG. 21 illustrates a system 2100 comprising four integrated circuit packages 2102, along with a switch integrated circuit package 2103, all housed in a multi-chip connector frame 2104. Conductors 2106 on or in the body of the connector frame couple edge contacts on the substrate assemblies of integrated circuit packages 2012 to corresponding edge contacts on the substrate assembly of switch integrated circuit package 2103, thus implementing a logical all-to-all connectivity network such as those described in relation to FIG. 9. Conductors 2107 may also be provided on or in the body of the connector frame to provide direct connections between edge contacts of physically adjacent integrated circuit packages, as shown, and also as described in relation to FIG. 9.

Figure 23:
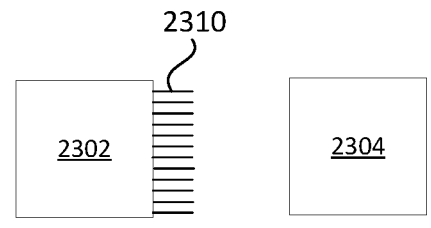
FIGS. 23A-23C are orthogonal views illustrating example integrated circuit packages having edge contacts, being assembled together and coupled to a PCB in accordance with the method of FIG. 22.
Figure 23:
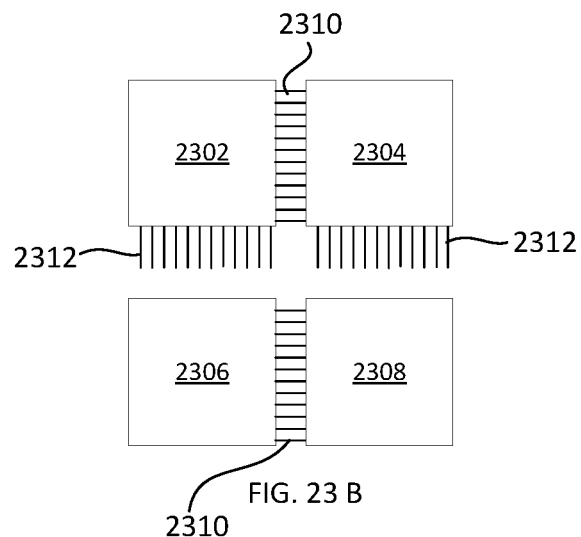
Figure 23:
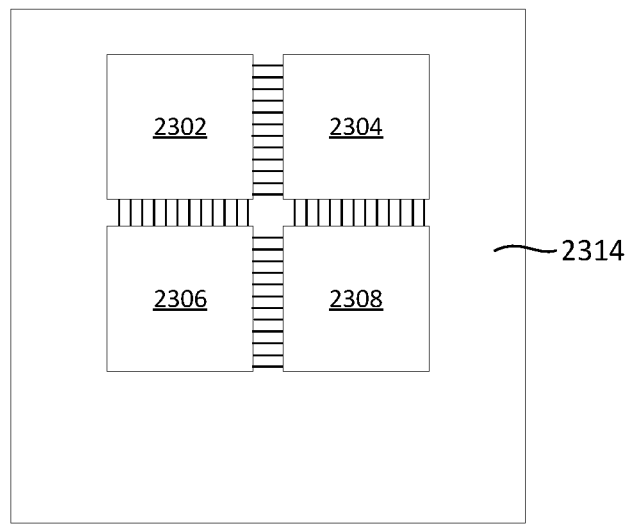

Referring now to FIGS. 22 and 23A-C, a general method will be described to manufacture edge-connected semiconductor systems such as those described above. The method begins at step 2202, during which two or more integrated circuit packages are obtained, each having edge contacts thereon. FIG. 23A illustrates step 2202 for an embodiment in which four such integrated circuit packages 2302, 2304, 2306, 2308 have been obtained. In the embodiment illustrated in FIG. 23A, the integrated circuit packages are of the type having a single-chip connector frame as described in relation to FIGS. 10-14. Thus, removable pins 2310 are inserted into sockets on the substrate assemblies of integrated circuit packages 2302, 2306 as shown, in preparation for step 2304.

In step 2304, a ganged assembly is formed with the integrated circuit packages by establishing conductive paths between their respective edge contacts. In the embodiment illustrated in FIG. 23B, this is accomplished by inserting the free ends of pins 2310 into sockets on the substrate assemblies of integrated circuit packages 2304, 2308, as shown.

For embodiments such as those described in relation to FIGS. 17-21, in which multi-chip connector frames are used, step 2204 may be performed by inserting the integrated circuit packages into a multi-chip connector frame, thereby establishing conductive paths between the edge contacts on the respective integrated circuit packages via the conductors that are disposed on or in the body of the connector frame. For single-chip connector frame embodiments, additional pins 2312 may be inserted into the sockets on integrated circuit packages 2302, 2304 as shown in FIG. 23B, and then the ganged assembly may be completed by inserting the free ends of pins 2312 into the sockets of integrated circuit packages 2306, 2308.

Having completed the ganged assembly, the method proceeds with step 2206. In this step, the ganged assembly may be coupled to a PCB by coupling host system contacts on the ganged assembly to corresponding contacts on the PCB. For example, in the embodiment illustrated in FIG. 23C, host contacts on the bottom or top sides of the substrate assemblies of integrated circuit packages 2302, 2304, 2306, 2308 may be coupled to corresponding contacts on or in PCB 2314 (or, as described above, into a socket that is coupled to the PCB). In other embodiments, a subset of the edge contacts on the ganged assembly may constitute the host system contacts. In the latter embodiments, step 2206 may be completed by coupling that subset of the edge contacts to corresponding contacts on or in the PCB. As was described above, PCB 2314 may constitute a motherboard or system board, or it may constitute a subsystem such as an add-on card that is configured to be mounted to a motherboard or system board.

In the embodiment illustrated in FIG. 23C, the ganged assembly is coupled to the PCB in a manner such that the planes of the substrate assemblies of the integrated circuit packages are substantially parallel to the plane of the PCB. In other embodiments, such as the one illustrated in FIG. 5, the ganged assembly may be coupled to the PCB in a manner such that the planes of the substrate assemblies are substantially orthogonal to the plane of the PCB.

Multiple specific embodiments have been described above and in the appended claims. Such embodiments have been provided by way of example and illustration. Persons having skill in the art and having reference to this disclosure will perceive various utilitarian combinations, modifications and generalizations of the features and characteristics of the embodiments so described. For example, steps in methods described herein may generally be performed in any order, and some steps may be omitted, while other steps may be added, except where the context clearly indicates otherwise. Similarly, components in structures described herein may be arranged in different positions or locations, and some components may be omitted, while other components may be added, except where the context clearly indicates otherwise. The scope of the disclosure is intended to include all such combinations, modifications, and generalizations as well as their equivalents.

What is claimed is:
1. A semiconductor system, comprising:
at least first and second integrated circuit packages, each of the packages comprising a substrate assembly having generally planar top and bottom sides and an edge surface, wherein the edge surface extends between the top and bottom sides and is oriented substantially orthogonally to planes of the top and bottom sides, and wherein each of the substrate assemblies comprises edge contacts disposed on the edge surface of the respective substrate assembly and facing in a direction substantially orthogonal to the edge surface;
a printed circuit board ("PCB") to which the first and second integrated circuit packages are coupled; and
package-to-package conductive paths coupling edge contacts of the first integrated circuit package with edge contacts of at least the second integrated circuit package, wherein the package-to-package conductive paths do not include traces on or inside the PCB.

2. The semiconductor system of claim 1, wherein:
each of the edge contacts comprises a socket configured to receive a removable pin; and
the package-to-package conductive paths comprise one or more of the removable pins.

3. The semiconductor system of claim 1, wherein:
the substrate assembly comprises a connector frame; and
the edge contacts are disposed on or in the connector frame.

4. The semiconductor system of claim 1, wherein:
each of the integrated circuit packages has a rectangular shape such that its edge comprises four edge sections;
in a first subset of the edge sections, the edge contacts are coupled to the package-to-package conductive paths; and
in a second subset of the edge sections, the edge contacts are coupled to the PCB.

5. The semiconductor system of claim 4, wherein the integrated circuit packages and the package-to-package conductive paths constitute a first ganged assembly, and wherein the semiconductor system further comprises:
a second ganged assembly substantially identical to the first ganged assembly and coupled to the PCB adjacent to the first ganged assembly; and
a cooling device disposed between the first and the second ganged assemblies and in thermal contact with at least one integrated circuit package in each of the first and the second ganged assemblies.

6. The semiconductor system of claim 1, wherein:
each of the integrated circuit packages further comprises an integrated circuit die having data communication circuitry therein coupled to at least some of the edge contacts of the respective integrated circuit package; and
the data communication circuitry is configured to exchange data between the integrated circuit packages through the conductive paths.

7. The semiconductor system of claim 6, wherein:
each of the integrated circuit packages is substantially identical to the others.

8. The semiconductor system of claim 6, wherein:
each of the integrated circuit packages comprises a digital data processor and a local memory associated with the data processor; and
the data communication circuitry is configured to transfer data from the memory of the data processor in one of the integrated circuit packages to the memory of the data processor in another of the integrated circuit packages.

9. The semiconductor system of claim 6, wherein:
each of the integrated circuit packages comprises a graphics processing unit.

10. A method of manufacturing a semiconductor system, comprising:
obtaining at least first and second integrated circuit packages, each of the packages comprising a substrate assembly having generally planar top and bottom sides and an edge surface, wherein the edge surface that extends between the top and bottom sides and is oriented substantially orthogonally to planes of the top and bottom sides, and wherein each of the substrate assemblies comprises edge contacts disposed on the edge surface of the respective substrate assembly and facing in a direction substantially orthogonal to the edge surface;
forming a ganged assembly of the first and the second integrated circuit packages by establishing conductive paths that couple edge contacts of the first integrated circuit package with edge contacts of at least the second integrated circuit package; and
coupling the ganged assembly to a printed circuit board ("PCB").

11. The method of claim 10:
wherein at least one of the substrate assemblies comprises host system contacts disposed on one of its top and bottom sides; and
the coupling of the ganged assembly to the PCB comprises coupling the host system contacts to corresponding contacts on or in the PCB such that the substrate assemblies are substantially parallel to the PCB.

12. The method of claim 10, wherein:
each of the integrated circuit packages has a rectangular shape, such that the edge comprises four edge sections;
the edge contacts of one of the edge sections comprise host system contacts; and
coupling the ganged assembly to the PCB comprises coupling the host system contacts to corresponding contacts on or in the PCB such that the substrate assemblies are substantially orthogonal to the PCB.

13. The method of claim 10, wherein:
forming the ganged assembly comprises inserting the integrated circuit packages into a multi-chip connector frame that is configured to provide the conductive paths.

14. A semiconductor system comprising:
a first integrated circuit package, the first integrated circuit package comprising:
a substrate assembly having generally planar top and bottom sides and an edge surface, wherein the edge surface extends between the top and the bottom sides and is oriented substantially orthogonally to planes of the top and bottom sides;
an integrated circuit die coupled to the substrate assembly and comprising a data processing unit, a memory associated with the data processing unit, and a data communication unit; and
first edge contacts disposed on the edge surface of the substrate assembly and coupled to the data communication unit, wherein the edge contacts face in a direction substantially orthogonal to the edge surface.

15. The semiconductor system of claim 14, wherein:
the data communication unit is configured to be coupled to second edge contacts disposed on a second integrated circuit package substantially identical to the first integrated circuit package.

16. The semiconductor system of claim 15, wherein:
the data communication unit is configured to implement memory transfer transactions with a second data communication unit disposed within the second integrated circuit package.

17. The semiconductor system of claim 14, wherein:
each of the edge contacts comprises a socket configured to receive a removable pin.

18. The semiconductor system of claim 17, wherein:
the substrate assembly comprises a connector frame; and the edge contacts are disposed on or in the connector frame.

19. The semiconductor system of claim 14:
wherein the substrate assembly has a rectangular shape such that its edge comprises four edge sections, and the first edge contacts are disposed along at least one of the four edge sections; and
further comprising second edge contacts disposed along another of the four edge sections;
wherein the second edge contacts are configured to be coupled to corresponding contacts on or in a printed circuit board ("PCB").

20. The semiconductor system of claim 14, wherein:
the substrate assembly further comprises contacts disposed on the top or the bottom side thereof and configured to be coupled to corresponding contacts on or in a printed circuit board ("PCB").

* * * * *